US 10,917,082 B1

(12) United States Patent
Clavette et al.

(10) Patent No.: US 10,917,082 B1
(45) Date of Patent: Feb. 9, 2021

(54) POWER MODULE AND ELECTRONIC SYSTEM

(71) Applicant: Infineon Technologies Austria AG, Villach (AT)

(72) Inventors: Danny Clavette, Greene, RI (US); Bang Sup Lee, Providence, RI (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 16/781,222

(22) Filed: Feb. 4, 2020

(51) Int. Cl.
| | |
|---|---|
| *H03K 17/082* | (2006.01) |
| *H03K 17/687* | (2006.01) |
| *H02M 1/08* | (2006.01) |
| *H02M 3/158* | (2006.01) |
| *H03K 17/16* | (2006.01) |

(52) U.S. Cl.
CPC .......... *H03K 17/0822* (2013.01); *H02M 1/08* (2013.01); *H02M 3/1588* (2013.01); *H03K 17/165* (2013.01); *H03K 17/6871* (2013.01)

(58) Field of Classification Search
CPC ............. H03K 17/0822; H03K 17/165; H03K 17/6871; H02M 1/08; H02M 3/1588
USPC .... 327/108–112, 427, 434, 437; 326/82, 83, 326/87
See application file for complete search history.

(56) References Cited

U.S. PATENT DOCUMENTS

| | | | |
|---|---|---|---|
| 2016/0043708 A1* | 2/2016 | Heringa | H01L 23/5226 327/109 |
| 2020/0091911 A1* | 3/2020 | Iwamizu | H03K 17/08122 |
| 2020/0243518 A1* | 7/2020 | Patti | H01L 21/8236 |

* cited by examiner

*Primary Examiner* — Tomi Skibinski

(74) *Attorney, Agent, or Firm* — Murphy, Bilak & Homiller, PLLC

(57) ABSTRACT

A power module includes: an embedding structure comprising an electrically insulating body, first terminals at a first side of the electrically insulating body, and second terminals at a second side of the electrically insulating body opposite the first side; a first semiconductor chip embedded in the electrically insulating body and comprising a vertical low-side power transistor; and a second semiconductor chip contacting the first set of terminals at the first side of the electrically insulating body and comprising a lateral high-side power transistor. The lateral high-side power transistor is electrically connected to the vertical low-side power transistor through one or more first electrically conductive paths embedded in the electrically insulating body to form a switch node of a half bridge circuit. The switch node is electrically connected to a corresponding one of the second terminals through one or more second electrically conductive paths embedded in the electrically insulating body.

23 Claims, 4 Drawing Sheets

POWER MODULE AND ELECTRONIC SYSTEM

BACKGROUND

In a synchronous buck converter, the driver, high-side power switch device and the low-side power switch device are each typically provided as separate semiconductor dies (chips). In some cases, a single or double metal clip are utilized to connect the two power switch devices together to form the switch node of a half bridge. In other cases, bond wires are used to form the switch node connection. A PWM (pulse width modulation) controller is typically provided as additional die where the connections between the controller and the driver are implemented by metal traces on a circuit board and/or by bond wires. High side current sense is also utilized with a bond wire. In addition, the connection of the driver die to the terminals of the high-side and low-side power switch devices are also implemented using bond wires or metal clips and individual die paddles that support the power switch devices. Such a connection configuration leads to high parasitic inductance. The parasitic inductance slows down the power supply turn on speed, resulting in lower power supply efficiency. In addition, a bond wire is conventionally utilized to connect to current/thermal monitoring which introduce inaccuracy into the measurement. Such factors reduce the high frequency power efficiency and thermal performance of conventional power modules.

Thus, there is a need for a power module having improved high frequency power efficiency and improved thermal performance.

SUMMARY

According to an embodiment of a power module, the power module comprises: an embedding structure comprising an electrically insulating body, first terminals at a first side of the electrically insulating body, and second terminals at a second side of the electrically insulating body opposite the first side; a first semiconductor chip embedded in the electrically insulating body and comprising a vertical low-side power transistor; and a second semiconductor chip contacting the first set of terminals at the first side of the electrically insulating body and comprising a lateral high-side power transistor, wherein the lateral high-side power transistor is electrically connected to the vertical low-side power transistor through one or more first electrically conductive paths embedded in the electrically insulating body to form a switch node of a half bridge circuit, wherein the switch node is electrically connected to a corresponding one of the second terminals through one or more second electrically conductive paths embedded in the electrically insulating body.

According to an embodiment of an electronic system, the electronic system comprises: a board; a load attached to the board; a power module configured to provide dc power to the load and comprising: an embedding structure comprising an electrically insulating body, first terminals at a first side of the electrically insulating body, and second terminals at a second side of the electrically insulating body opposite the first side, the second terminals contacting corresponding board terminals of the board; a first semiconductor chip embedded in the electrically insulating body and comprising a vertical low-side power transistor; and a second semiconductor chip contacting the first set of terminals at the first side of the electrically insulating body and comprising a lateral high-side power transistor, wherein the lateral high-side power transistor is electrically connected to the vertical low-side power transistor through one or more first electrically conductive paths embedded in the electrically insulating body to form a switch node of a half bridge circuit configured to supply an output voltage to the load, the switch node being electrically connected to a corresponding one of the second terminals through one or more second electrically conductive paths embedded in the electrically insulating body; and a controller configured to control operation of the power module and thereby regulate the dc power provided to the load.

According to another embodiment of a power module, the power module comprises: an embedding structure comprising an electrically insulating body, a first set of terminals at a first side of the electrically insulating body, and a second set of terminals at a second side of the electrically insulating body opposite the first side; a first semiconductor chip embedded in the electrically insulating body and comprising a vertical low-side power transistor; and a second semiconductor chip attached to the first set of terminals at the first side of the electrically insulating body and comprising a lateral high-side power transistor, wherein all signal I/O (input/output) and input power connections to the second semiconductor chip are provided by a subset of the second set of terminals at the second side of the electrically insulating body and by electrically conductive paths embedded in the electrically insulating body, wherein the vertical low-side power transistor and the lateral high-side power transistor are electrically connected within the embedding structure to form a switch node of a half bridge circuit, wherein a terminal included in the second set of terminals at the second side of the electrically insulating body provides a point of external electrical contact for the switch node.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described provide a power module that includes a first semiconductor chip having a vertical low-side power transistor and embedded in an electrically insulating body, and a second semiconductor chip having a lateral high-side power transistor and mounted to the electrically insulating body in a flip-chip configuration so as to contact terminals at a first mounting side of the electrically insulating body. The lateral high-side power transistor included in the first semiconductor chip is electrically connected to the vertical low-side power transistor included in the second semiconductor chip through one or more electrically conductive paths embedded in the electrically insulating body to form a switch node of a half bridge circuit, without having to use bond wire or metal clip connections. The switch node and terminals of the semiconductor chips are electrically connected to corresponding terminals at a second mounting side of the electrically insulating body opposite the first mounting side to which the second semiconductor chip is attached. Accordingly, the power module may be attached to another module, a circuit board, etc. at the second mounting side of the electrically insulating body. Parasitic inductance is reduced by eliminating bond wire and metal clip connections between the first and second semiconductor chips, thereby increasing high frequency power efficiency and thermal performance of the power module. Described next are various embodiments of the power module and an electronic system that includes the power module.

Figure 1:
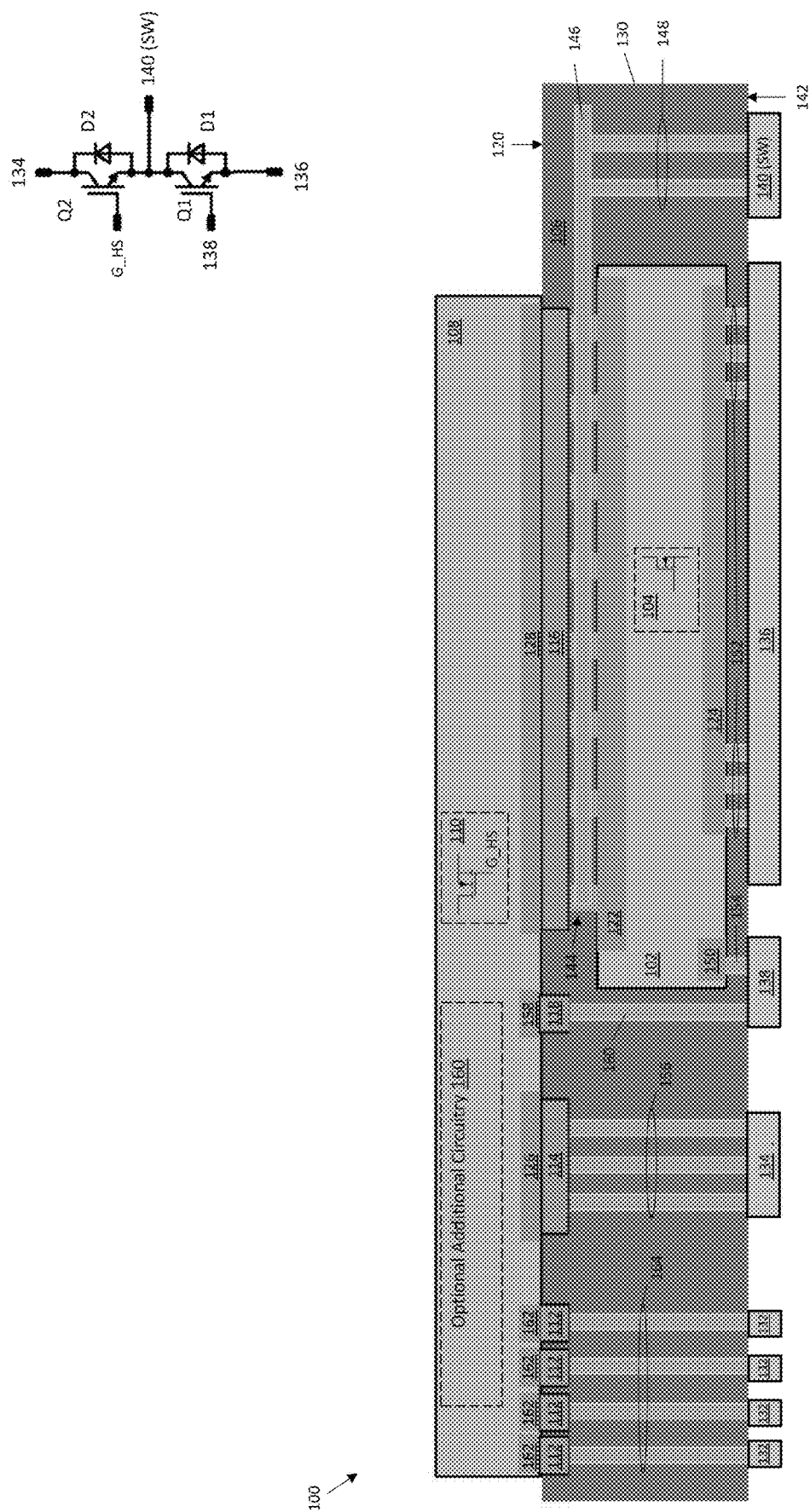
FIG. 1 illustrates a cross-sectional view of an embodiment of a power module.

FIG. 1 illustrates a cross-sectional view of an embodiment of a power module 100 that includes a first semiconductor chip (die) 102 having a vertical low-side power transistor 104 and embedded in an electrically insulating body 106, and a second semiconductor chip 108 having a lateral high-side power transistor 110 and mounted to the electrically insulating body 106 in a flip-chip configuration so as to contact terminals 112, 114, 116, 118 at a first mounting side 120 of the electrically insulating body 106 without having to use bond wire or metal clip connections. The vertical low-side power transistor 104 included in the first semiconductor chip 102 is a vertical device in that the primary current flow path of the device is between load terminals 122, 124 at opposite main sides of the first semiconductor chip 102. The lateral high-side power transistor 110 included in the second semiconductor chip 108 is a lateral device in that the primary current flow path of the device is between load terminals 126, 128 at the same main side of the second semiconductor chip 108 and which is attached to the first mounting side 120 of the electrically insulating body 106.

The electrically insulating body 106 is part of an embedding structure 130. The embedding structure 130 also includes first terminals 112, 114, 116, 118 at the first mounting side 120 of the electrically insulating body 106 and second terminals 132, 134, 136, 138, 140 at a second mounting side 142 of the electrically insulating body 106 opposite the first mounting side 120. In one embodiment, the electrically insulating body 106 of the embedding structure 130 is a non-conductive substrate of a printed circuit board (PCB) and the non-conductive substrate has a cavity in which the first semiconductor chip 102 is arranged. The cavity may or may not be filled with an electrically insulating material such as a resin. The PCB may be a single-layer or multi-layer PCB. In general, the embedding structure 130 may be any type of structure having an electrically insulating body 106 in which the first semiconductor chip 102 can be embedded and terminals 112-116, 132-14 at opposing sides of the electrically insulating body 106. For example, the embedding structure 130 may be a laminate, QFM package, PCB, etc.

The lateral high-side power transistor 110 included in the second semiconductor chip 108 mounted to the embedding structure 130 is electrically connected to the vertical low-side power transistor 104 included in the first semiconductor chip 102 embedded in the electrically insulating body 106 of the embedding structure 130 through one or more corresponding electrically conductive paths 144, 146 also embedded in the electrically insulating body 106 to form a switch node (SW) of a half bridge circuit, without using bond wire or metal clip connections. The switch node connection formed between the chips 102, 108 within the electrically insulating body 106 of the embedding structure 130 may include electrically conductive vias 144 and/or one or more metal traces 146. The switch node of the half bridge circuit is electrically connected to a corresponding terminal 140 at the second mounting side 142 of the embedding structure 130 through one or more corresponding electrically conductive paths 146, 148 embedded in the electrically insulating body 106. The embedded connection to the switch node terminal 140 at the second mounting side 142 of the embedding structure 130 may be formed by one or more metal traces 146 and/or electrically conductive vias 148.

The upper right corner of FIG. 1 includes a circuit schematic of the half bridge circuit formed by the vertical low-side power transistor 104 included in the first semiconductor chip 102 and the lateral high-side power transistor 110 included in the second semiconductor chip 108, where transistor Q1 corresponds to the vertical low-side power transistor 104 and transistor Q2 corresponds to the lateral high-side power transistor 110. The switch node formed by the coupled connection of the semiconductor chips 102, 108 is labelled 'SW' in FIG. 1. The diodes D1, D2 shown in the schematic view of FIG. 1 may be monolithically integrated in the corresponding semiconductor chips 102, 108 or may be discrete components.

In one embodiment, the vertical low-side power transistor 104 included in the semiconductor chip 102 embedded in the embedding structure 130 is a vertical power MOSFET. Source and gate terminals 124, 150 of the vertical power MOSFET face the second mounting side 142 of the electrically insulating body 106 and are electrically connected to corresponding terminals 136, 138 at the second mounting side 142 of the electrically insulating body 106 through respective electrically conductive paths 152, 154 embedded in the electrically insulating body 106 between the first semiconductor chip 102 and the second mounting side 142 of the embedding structure 130. The respective connections between the source and gate terminals 124, 150 of the vertical power MOSFET and the corresponding terminals 136, 138 at the second mounting side 142 of the electrically insulating body 106 may be formed by electrically conductive vias 152, 154 embedded in the electrically insulating body 106. The drain terminal 122 of the vertical power MOSFET faces the first mounting side 120 of the electrically insulating body 106 and forms part of the half bridge switch node.

The lateral high-side power transistor 110 included in the semiconductor chip 108 attached to the first mounting side 120 of the embedding structure 130 may be a lateral power MOSFET. The drain terminal 126 of the lateral power MOSFET faces the first mounting side 120 of the electrically insulating body 106 and contacts a corresponding terminal 114 at the first mounting side 120. This terminal 114 at the first mounting side 120 of the electrically insulating body 106 is electrically connected to the corresponding terminal 134 at the second mounting side 142 of the electrically insulating body 106 through one or more electrically conductive paths 156 such as electrically conductive vias and/or metal traces embedded in the electrically insulating body 106.

The source terminal 128 of the lateral power MOSFET also faces the first mounting side 120 of the electrically insulating body 106, forms part of the half bridge switch node and contacts the corresponding terminal 116 of the embedding structure 130 at the first mounting side 120 of the electrically insulating body 106. The source terminal 128 of the lateral power MOSFET is electrically connected to the drain terminal 122 of the vertical power MOSFET through respective electrically conductive paths 144, 146 embedded in the electrically insulating body 106 between the first semiconductor chip 102 and the first mounting side 120 of the electrically insulating body 106, as previously explained herein. In one embodiment, the source terminal 128 of the lateral power MOSFET and the drain terminal 122 of the vertical power MOSFET at least partly overlap with one another as shown in FIG. 1. This, however, is just an example configuration. There may be partial or complete lateral overlap between the source terminal 128 of the lateral power MOSFET and the drain terminal 122 of the vertical power MOSFET, or no lateral overlap at all.

The second semiconductor chip 108 attached to the first mounting side 120 of the embedding structure 130 may also include a low-side gate terminal 158 which faces the first mounting side 120 of the electrically insulating body 106 and is electrically connected to the gate terminal 150 of the first semiconductor chip 102 embedded in the electrically insulating body 106. For example, the second semiconductor chip 108 may include optional additional circuitry 160 which may include a gate driver for the power transistors 104, 110 included in one or both of the first and second semiconductor chips 102, 108. In this example, the connection to the gate (G_HS) of the lateral high-side power transistor 110 included in the second semiconductor chip 108 is internal to the second semiconductor chip 108 since the gate driver is monolithically integrated therein. The control signal from the gate driver to the vertical low-side power transistor 104 included in the first semiconductor chip 102 may be output at the low-side gate terminal 158 of the second semiconductor chip 108 and delivered to the gate terminal 150 of the first semiconductor chip 102 through corresponding electrically conductive paths 154, 160 embedded in the electrically insulating body 106 and the corresponding terminals 118, 138 at the opposite mounting sides 120, 142 of the embedding structure 130.

The second semiconductor chip 108 may include signal I/O terminals 162 at the same side of the chip 108 as the other terminals 126, 128, 158. The signal I/O terminals 162 may be used for sending and receiving control signals, telemetry information, etc. For example, one such signal may be a PWM signal for controlling a gate driver monolithically integrated in the second semiconductor chip 108. The signal I/O terminals 162 of the second semiconductor chip 108 contact corresponding signal I/O terminals 112 at the first mounting side 120 of the embedding structure 130. The signal I/O terminals 112 at the first mounting side 120 of the embedding structure 130 are electrically connected to respective signal I/O terminals 132 at the second mounting side 142 of the embedding structure 130 through corresponding electrically conductive paths 164 such as electrically conductive vias and/or metal traces embedded in the electrically insulating body 106. In one embodiment, all signal I/O (input/output) and input power connections to the second semiconductor chip 108 are provided by a subset 132, 134 of the terminals 132, 134, 136, 138 at the second mounting side 142 of the electrically insulating body 106 and by corresponding electrically conductive paths 156, 164 embedded in the electrically insulating body 106. Another terminal 140 at the second mounting side 142 of the electrically insulating body 106 provides a point of external electrical contact for the switch node formed by the power transistors 104, 110 included in the first and second semiconductor chips 102, 108.

If the gate driver for the power transistor 104 included in the first semiconductor chip 102 is not monolithically integrated with the lateral high-side power transistor 110 in the second semiconductor chip 108, the control signal for the vertical low-side power transistor 104 included in the first semiconductor chip 102 may be delivered by an external driver IC or other die via the corresponding terminal 138 at the second mounting side 142 of the electrically insulating body 106.

As explained above, the optional additional circuitry 160 included in the semiconductor chip 108 attached to the embedding structure 130 at the first mounting side 120 of the electrically insulating body 106 may include driver circuitry for one or both of the power transistors 104, 110 included in the first and second semiconductor chips 102, 108.

Figure 2:
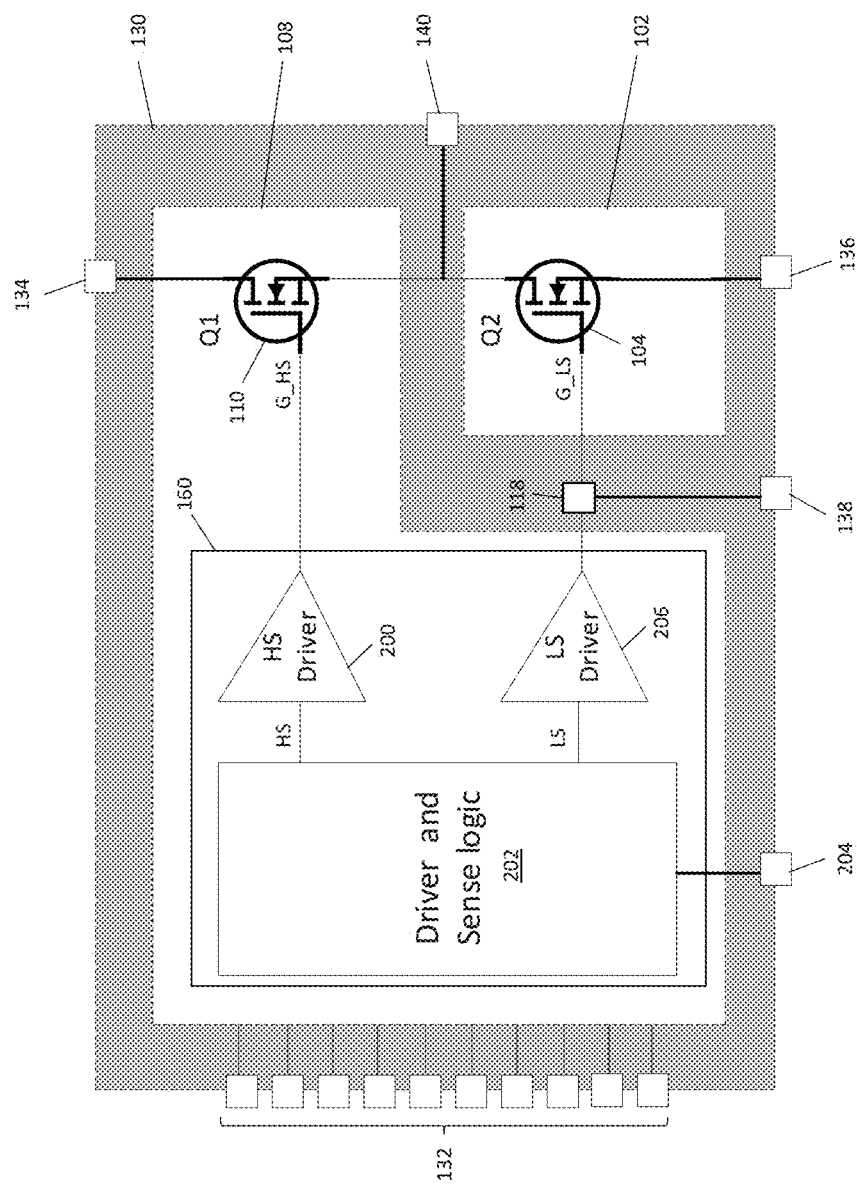
FIG. 2 illustrates a schematic illustration of an embodiment of the power module.

FIG. 2 illustrates a schematic illustration of an embodiment of the power module 100 and according to which the optional additional circuitry 160 of the semiconductor chip 108 attached to the embedding structure 130 at the first mounting side 120 of the electrically insulating body 106 includes a first driver circuit 200 monolithically integrated with the lateral high-side power transistor 110. The first driver circuit 200 is configured to drive the control terminal G_HS of the lateral high-side power transistor 110 responsive to a high-side gate drive signal HS. The high-side gate drive signal HS may be generated by driver and sense logic 202 included in the optional additional circuitry 160 of the second semiconductor chip 108. For example, a PWM control signal may be received at one of the signal I/O terminals 132 of the power module 100 and the driver and sense logic 202 may generate the high-side gate drive signal HS based on the duty cycle of the received PWM signal. The power module 100 may include a separate ground/reference terminal 204 for the driver and sense logic 202.

The optional additional circuitry 160 of the semiconductor chip 108 attached to the embedding structure 130 at the first mounting side 120 of the electrically insulating body 106 may further include a second driver circuit 206 monolithically integrated with the first driver circuit 200, the driver and sense logic 202, and the lateral high-side power transistor 110. The second driver circuit 206 is configured to drive the control terminal G_LS of the vertical low-side power transistor 104 included in the semiconductor chip 102 which is embedded in the embedding structure 130 of the power module 100. To this end, the second driver circuit 206 is electrically connected to the control terminal G_LS of the vertical low-side power transistor 104 through corresponding terminals 118, 138 at opposite sides 120, 142 of the embedding structure 130 and through one or more electrically conductive paths 154, 160 embedded in the electrically insulating body 106 of the embedding structure 130 and which connect the oppositely positioned terminals 118, 138 of the embedding structure 130.

The second driver circuit 206 drives the control terminal G_HS of the vertical low-side power transistor 104 included in the semiconductor chip 102 which is embedded in the embedding structure 130 responsive to a low-side gate drive signal LS. The low-side gate drive signal LS may be generated by the driver and sense logic 202 included in the optional additional circuitry 160 of the second semiconductor chip 108. For example, the driver and sense logic 202 may generate the low-side gate drive signal LS based on the duty cycle of a PWM signal received at one of the signal I/O terminals 132 of the power module 100. In addition to generating the gate drive signals HS, LS, the driver and sense logic 202 may also include circuitry for sensing current and/or temperature of the second semiconductor chip 108 and reporting related telemetry information via one or more of the signal I/O terminals 132 of the power module 100.

Figure 3:
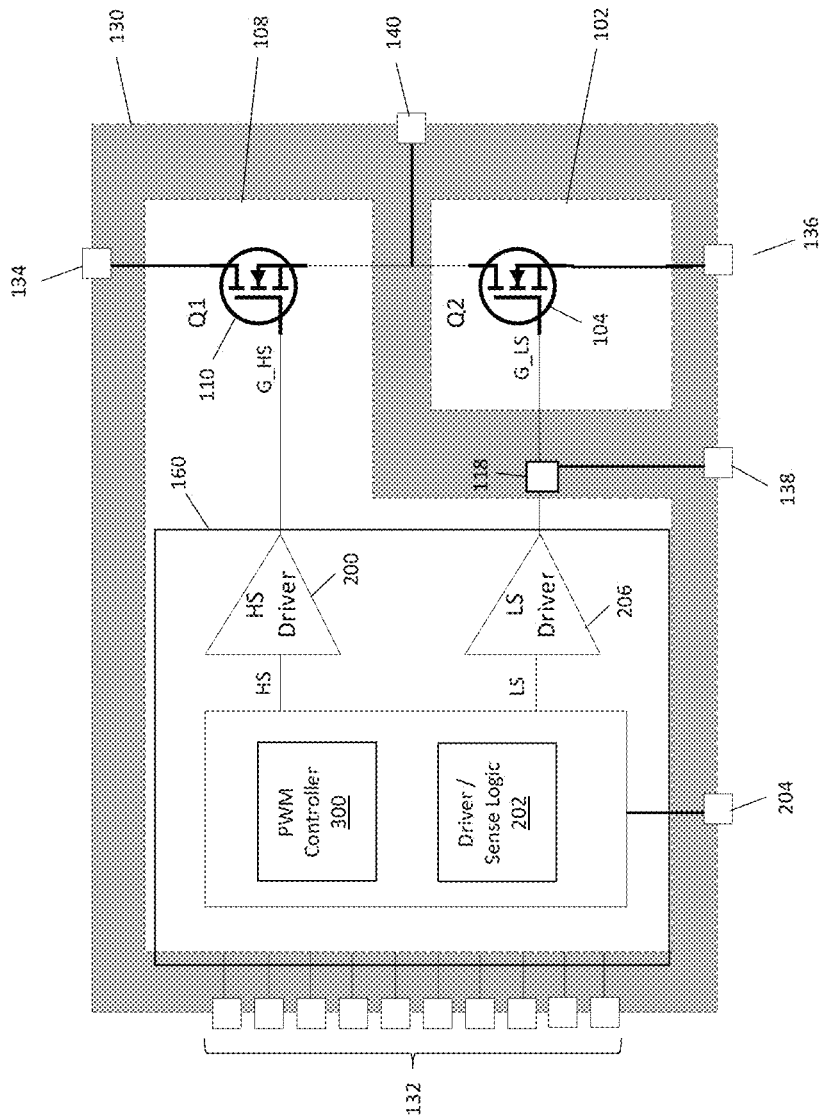
FIG. 3 illustrates a schematic illustration of another embodiment of the power module.

FIG. 3 illustrates a schematic illustration of an embodiment of the power module 100 and according to which the optional additional circuitry 160 of the semiconductor chip 108 attached to the embedding structure 130 at the first mounting side 120 of the electrically insulating body 106 includes the first and second driver circuits 200, 206 and the driver and sense logic 202 shown in FIG. 2, and further includes a modulator 300 monolithically integrated with the driver circuits 200, 206, the driver and sense logic 202, and the lateral high-side power transistor 110. The modulator 300 generates modulation signals for controlling the switching of the lateral high-side power transistor 110 and the vertical low-side power transistor 104. The modulator 300 is electrically connected to the first driver circuit 200 and the second driver circuit 206 within the second semiconductor chip 108. In one embodiment, the modulator 300 is a PWM modulator that generates PWM signals for controlling the on and off durations of the power transistors 104, 110 included in the first and second semiconductor chips 102, 108 to regulate the voltage at the switch node terminal 140 of the power module 100.

The modulator 300 may be implemented in the form of a controller which, together with the first and second driver circuits 200, 206, the driver and sense logic 202, and the power transistors 104, 110, form a power converter or a voltage regulator (VR). The controller and/or driver functionality instead may be implemented outside the power module 100. For example, a processor that is to be supplied current via the half bridge circuit formed by the power transistors 104, 110 may provide VR control functionality to the power module 100, thereby eliminating the need for a separate VR controller. The driver circuit 200/206 for one or both of the power transistors 104, 110 also may be located outside the power module 100. Various passive components such as capacitors and/or inductors that make up a power converter or voltage regulator may be included in the power module 100, surface mounted to the power module 100, located on a separate board, etc.

Figure 4:
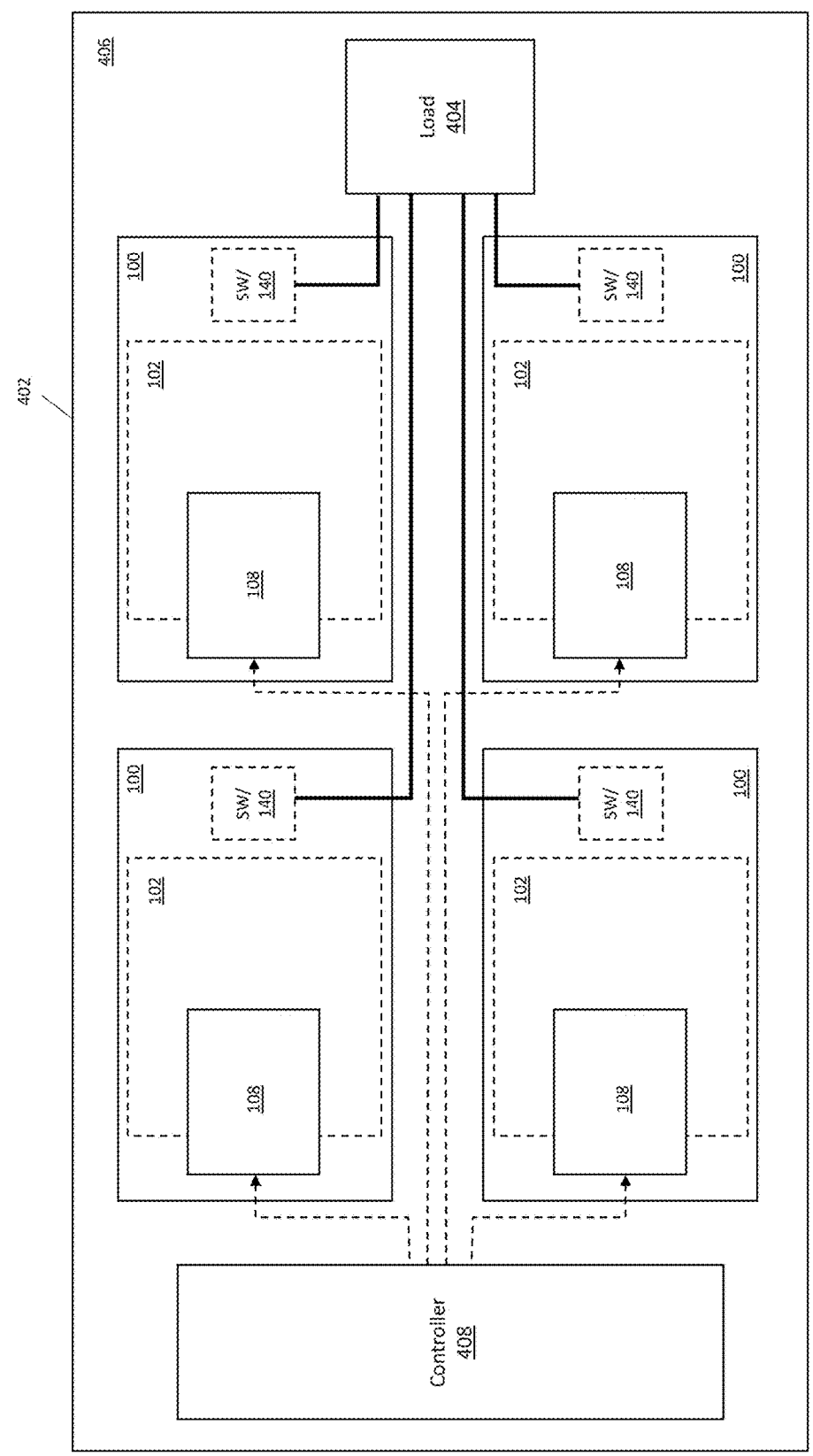
FIG. 4 illustrates a schematic view of an embodiment of an electronic system that includes at least one of the power modules.

FIG. 4 illustrates a schematic view of an embodiment of an electronic system 400 that includes at least one of the power modules 100. The electronic system 400 also includes a board 402 and at least one load 404 attached to the board 402. In one embodiment, the load 404 is a processor subsystem which may include one or more processors and related memory. The term "processor" as used herein means an electronic circuit which performs operations on an external data source such as memory or some other data stream. The term "processor" as used herein includes CPUs, microprocessors, GPUs, DSPs, image processors, network or packet processors, coprocessors, multi-core processors, front-end processors, baseband processors, etc. The type of processor depends on the electronic system 400. For example, in the case of a computer, server, mobile device, etc., the load 404 may be a CPU, a microprocessor, a coprocessor, a multi-core processor, a front-end processor, etc. In the case of a network interface that manages radio functions of a wireless network, the load 404 may be a baseband processor. In the case of a graphics card, the load 404 may be a GPU or an image processor. In the case of a network interface card, the load 404 may be a network or packet processor. These are just some examples of electronic systems and related loads, and should not be considered limiting.

At least one instance of the power module 100 is attached to the system board 100 and configured to provide dc power to the load 404. For example, in the case of a multi-phase VR, at least two of the power modules 100 may be attached to the system board 100 with each power module 100 providing one phase current to the load 404. Phases may be enabled and disabled at different points of operation, as load demand warrants. Each power module 100 attached to the system board 100 has the construction and function previously described herein. Accordingly, each power module 100 attached to the system board 100 provides a switch node (SW) of a half bridge circuit for supplying an output voltage to the load 404.

In the top down plan view of FIG. 4, the semiconductor chip 102 which is embedded in the embedding structure 130 of each power module 100 is out of view. So is the switch node (SW) terminal 140 at the second mounting side 142 of the embedding structure 130 of each power module 100. These components of the power modules 100 are illustrated as dashed boxes in FIG. 4. All other components of the power modules 100 which are out of view in FIG. 4 are not shown to provide an unobstructed view of the other components of the electronic system 400. The terminals 132, 134, 136, 138, 140 at the second mounting side 142 of the embedding structure 130 of each power module 100 contact corresponding terminals, traces, bond pads, etc. at the facing side 406 of the system board.

The electronic system 400 also may include a separate controller 408 for controlling operation of each power module 100 attached to the system board 402, thereby regulating the dc power provided to the load 404. Communication between the controller 408 and each power module 100 attached to the system board 402 is illustrated using dashed lines with arrows in FIG. 4.

As previously described herein, the power module control functionality instead may be monolithically integrated in each semiconductor chip 108 that includes a lateral high-side power transistor 110 or may be performed by the load 404 if the load 404 is a processor. The connection between the switch node terminal 140 of each power module 100 attached to the system board 402 and the load 404 is illustrated simplistically in FIG. 4 as respective solid lines. However, there may be additional components in the electrical pathway between each switch node terminal 140 and the load 404. For example, inductors, capacitors, filters, etc. may be coupled in the electrical pathways between the switch node terminals 140 and the load 404. In the case of a buck converter, the power transistors 104, 110 of a power module 100 are electrically connected in a half-bridge configuration at a switch node terminal 140 which is electrically connected to an output inductor (not shown) of a single phase. The output inductor provides a phase current to the load 404.

In one embodiment, the power transistors 104, 110 of each power module 100 attached to the system board 402 form a non-isolated point-of-load power converter configured to accept power input from an isolated dc-dc converter (not shown) and provide dc power to a close-proximity load 404.

Although the present disclosure is not so limited, the following numbered examples demonstrate one or more aspects of the disclosure.

Example 1. A power module, comprising: an embedding structure comprising an electrically insulating body, first terminals at a first side of the electrically insulating body, and second terminals at a second side of the electrically insulating body opposite the first side; a first semiconductor chip embedded in the electrically insulating body and comprising a vertical low-side power transistor; and a second semiconductor chip contacting the first set of terminals at the first side of the electrically insulating body and comprising a lateral high-side power transistor, wherein the lateral high-side power transistor is electrically connected to the vertical low-side power transistor through one or more first electrically conductive paths embedded in the electrically insulating body to form a switch node of a half bridge circuit, wherein the switch node is electrically connected to a corresponding one of the second terminals through one or more second electrically conductive paths embedded in the electrically insulating body.

Example 2. The power module of example 1, wherein the second semiconductor chip further comprises a first driver circuit monolithically integrated with the lateral high-side power transistor and configured to drive a control terminal of the lateral high-side power transistor.

Example 3. The power module of example 2, wherein the second semiconductor chip further comprises a second driver circuit monolithically integrated with the first driver circuit and the lateral high-side power transistor and configured to drive a control terminal of the vertical low-side power transistor, and wherein the second driver circuit is electrically connected to the control terminal of the vertical low-side power transistor through one or more fourth electrically conductive paths embedded in the electrically insulating body.

Example 4. The power module of example 3, wherein the second semiconductor chip further comprises a modulator monolithically integrated with the first driver circuit, the second driver circuit and the lateral high-side power transistor and configured to generate modulation signals for controlling switching of the lateral high-side power transistor and the vertical low-side power transistor, and wherein the modulator is electrically connected to the first driver circuit and the second driver circuit within the second semiconductor chip.

Example 5. The power module of any of examples 1 through 4, wherein the vertical low-side power transistor is a vertical power MOSFET, wherein gate and source terminals of the vertical power MOSFET face the second side of the electrically insulating body and are electrically connected to corresponding ones of the second terminals through respective electrically conductive paths embedded in the electrically insulating body between the first semiconductor chip and the second side of the electrically insulating body, and wherein a drain terminal of the vertical power MOSFET faces the first side of the electrically insulating body and forms part of the switch node.

Example 6. The power module of example 5, wherein the lateral high-side power transistor is a lateral power MOSFET, wherein gate and drain terminals of the lateral power MOSFET face the first side of the electrically insulating body and contact corresponding ones of the first terminals, and wherein a source terminal of the lateral power MOSFET faces the first side of the electrically insulating body, forms part of the switch node and is electrically connected to the drain terminal of the vertical power MOSFET through respective electrically conductive paths embedded in the electrically insulating body between the first semiconductor chip and the first side of the electrically insulating body.

Example 7. The power module of example 6, wherein the source terminal of the lateral power MOSFET and the drain terminal of the vertical power MOSFET at least partly overlap with one another.

Example 8. The power module of any of examples 1 through 7, wherein the electrically insulating body of the embedding structure is a non-conductive substrate of a printed circuit board, wherein the non-conductive substrate has a cavity, and wherein the first semiconductor chip is arranged in the cavity.

Example 9. The power module of any of examples 1 through 8, wherein the first semiconductor chip and the second semiconductor chip form a non-isolated point-of-load power converter configured to accept power input from an isolated dc-dc converter and provide dc power to a close-proximity load.

Example 10. The power module of any of examples 1 through 9, wherein the first terminals are electrically connected to corresponding ones of the second terminals through third electrically conductive paths embedded in the electrically insulating body.

Example 11. An electronic system, comprising: a board; a load attached to the board; a power module configured to provide dc power to the load and comprising: an embedding structure comprising an electrically insulating body, first terminals at a first side of the electrically insulating body, and second terminals at a second side of the electrically insulating body opposite the first side, the second terminals contacting corresponding board terminals of the board; a first semiconductor chip embedded in the electrically insulating body and comprising a vertical low-side power transistor; and a second semiconductor chip contacting the first set of terminals at the first side of the electrically insulating body and comprising a lateral high-side power transistor, wherein the lateral high-side power transistor is electrically connected to the vertical low-side power transistor through one or more first electrically conductive paths embedded in the electrically insulating body to form a switch node of a half bridge circuit configured to supply an output voltage to the load, the switch node being electrically connected to a corresponding one of the second terminals through one or more second electrically conductive paths embedded in the electrically insulating body; and a controller configured to control operation of the power module and thereby regulate the dc power provided to the load.

Example 12. The electronic system of example 11, wherein the second semiconductor chip further comprises a first driver circuit monolithically integrated with the lateral high-side power transistor and configured to drive a control terminal of the lateral high-side power transistor.

Example 13. The electronic system of example 12, wherein the second semiconductor chip further comprises a second driver circuit monolithically integrated with the first driver circuit and the lateral high-side power transistor and configured to drive a control terminal of the vertical low-side power transistor, and wherein the second driver circuit is electrically connected to the control terminal of the vertical low-side power transistor through one or more fourth electrically conductive paths embedded in the electrically insulating body.

Example 14. The electronic system of example 13, wherein the second semiconductor chip further comprises a modulator monolithically integrated with the first driver circuit, the second driver circuit and the lateral high-side power transistor and configured to generate modulation signals for controlling switching of the lateral high-side power transistor and the vertical low-side power transistor, and wherein the modulator is electrically connected to the first driver circuit and the second driver circuit within the second semiconductor chip.

Example 15. The electronic system of example 14, wherein the second semiconductor chip further comprises the controller monolithically integrated with the modulator, the first driver circuit, the second driver circuit and the lateral high-side power transistor.

Example 16. The electronic system of any of examples 11 through 15, wherein the vertical low-side power transistor is a vertical power MOSFET, wherein gate and source terminals of the vertical power MOSFET face the second side of the electrically insulating body and are electrically connected to corresponding ones of the second terminals through respective electrically conductive paths embedded in the electrically insulating body between the first semiconductor chip and the second side of the electrically insulating body, and wherein a drain terminal of the vertical power MOSFET faces the first side of the electrically insulating body and forms part of the switch node.

Example 17. The electronic system of example 16, wherein the lateral high-side power transistor is a lateral power MOSFET, wherein gate and drain terminals of the lateral power MOSFET face the first side of the electrically insulating body and contact corresponding ones of the first terminals, and wherein a source terminal of the lateral power MOSFET faces the first side of the electrically insulating body, forms part of the switch node and is electrically connected to the drain terminal of the vertical power MOSFET through respective electrically conductive paths embedded in the electrically insulating body between the first semiconductor chip and the first side of the electrically insulating body.

Example 18. The electronic system of example 17, wherein the source terminal of the lateral power MOSFET and the drain terminal of the vertical power MOSFET at least partly overlap with one another.

Example 19. The electronic system of any of examples 11 through 18, wherein the electrically insulating body of the embedding structure is a non-conductive substrate of a printed circuit board, wherein the non-conductive substrate has a cavity, and wherein the first semiconductor chip is arranged in the cavity.

Example 20. The electronic system of any of examples 11 through 19, wherein the first semiconductor chip and the second semiconductor chip form a non-isolated point-of-load power converter configured to accept power input from an isolated dc-dc converter and provide dc power to the load.

Example 21. The electronic system of any of examples 11 through 20, wherein the first terminals are electrically connected to corresponding ones of the second terminals through third electrically conductive paths embedded in the electrically insulating body.

Example 22. A power module, comprising: an embedding structure comprising an electrically insulating body, a first set of terminals at a first side of the electrically insulating body, and a second set of terminals at a second side of the electrically insulating body opposite the first side; a first semiconductor chip embedded in the electrically insulating body and comprising a vertical low-side power transistor; and a second semiconductor chip attached to the first set of terminals at the first side of the electrically insulating body and comprising a lateral high-side power transistor, wherein all signal I/O and input power connections to the second semiconductor chip are provided by a subset of the second set of terminals at the second side of the electrically insulating body and by electrically conductive paths embedded in the electrically insulating body, wherein the vertical low-side power transistor and the lateral high-side power transistor are electrically connected within the embedding structure to form a switch node of a half bridge circuit, wherein a terminal included in the second set of terminals at the second side of the electrically insulating body provides a point of external electrical contact for the switch node.

Example 23. The power module of example 22, wherein the second semiconductor chip further comprises a driver circuit for the lateral high-side power transistor.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power module, comprising:
an embedding structure comprising an electrically insulating body, first terminals at a first side of the electrically insulating body, and second terminals at a second side of the electrically insulating body opposite the first side;
a first semiconductor chip embedded in the electrically insulating body and comprising a vertical low-side power transistor; and
a second semiconductor chip contacting the first set of terminals at the first side of the electrically insulating body and comprising a lateral high-side power transistor,
wherein the lateral high-side power transistor is electrically connected to the vertical low-side power transistor through one or more first electrically conductive paths embedded in the electrically insulating body to form a switch node of a half bridge circuit,
wherein the switch node is electrically connected to a corresponding one of the second terminals through one or more second electrically conductive paths embedded in the electrically insulating body.

2. The power module of claim 1, wherein the second semiconductor chip further comprises a first driver circuit monolithically integrated with the lateral high-side power transistor and configured to drive a control terminal of the lateral high-side power transistor.

3. The power module of claim 2, wherein the second semiconductor chip further comprises a second driver circuit monolithically integrated with the first driver circuit and the lateral high-side power transistor and configured to drive a control terminal of the vertical low-side power transistor, and wherein the second driver circuit is electrically connected to the control terminal of the vertical low-side power transistor through one or more fourth electrically conductive paths embedded in the electrically insulating body.

4. The power module of claim 3, wherein the second semiconductor chip further comprises a modulator monolithically integrated with the first driver circuit, the second driver circuit and the lateral high-side power transistor and configured to generate modulation signals for controlling switching of the lateral high-side power transistor and the vertical low-side power transistor, and wherein the modulator is electrically connected to the first driver circuit and the second driver circuit within the second semiconductor chip.

5. The power module of claim 1, wherein the vertical low-side power transistor is a vertical power MOSFET, wherein gate and source terminals of the vertical power MOSFET face the second side of the electrically insulating body and are electrically connected to corresponding ones of the second terminals through respective electrically conductive paths embedded in the electrically insulating body between the first semiconductor chip and the second side of the electrically insulating body, and wherein a drain terminal of the vertical power MOSFET faces the first side of the electrically insulating body and forms part of the switch node.

6. The power module of claim 5, wherein the lateral high-side power transistor is a lateral power MOSFET, wherein gate and drain terminals of the lateral power MOSFET face the first side of the electrically insulating body and contact corresponding ones of the first terminals, and wherein a source terminal of the lateral power MOSFET faces the first side of the electrically insulating body, forms part of the switch node and is electrically connected to the drain terminal of the vertical power MOSFET through respective electrically conductive paths embedded in the electrically insulating body between the first semiconductor chip and the first side of the electrically insulating body.

7. The power module of claim 6, wherein the source terminal of the lateral power MOSFET and the drain terminal of the vertical power MOSFET at least partly overlap with one another.

8. The power module of claim 1, wherein the electrically insulating body of the embedding structure is a non-conductive substrate of a printed circuit board, wherein the non-conductive substrate has a cavity, and wherein the first semiconductor chip is arranged in the cavity.

9. The power module of claim 1, wherein the first semiconductor chip and the second semiconductor chip form a non-isolated point-of-load power converter configured to accept power input from an isolated dc-dc converter and provide dc power to a close-proximity load.

10. The power module of claim 1, wherein the first terminals are electrically connected to corresponding ones of the second terminals through third electrically conductive paths embedded in the electrically insulating body.

11. An electronic system, comprising:
a board;
a load attached to the board;
a power module configured to provide dc power to the load and comprising:
an embedding structure comprising an electrically insulating body, first terminals at a first side of the electrically insulating body, and second terminals at a second side of the electrically insulating body opposite the first side, the second terminals contacting corresponding board terminals of the board;
a first semiconductor chip embedded in the electrically insulating body and comprising a vertical low-side power transistor; and
a second semiconductor chip contacting the first set of terminals at the first side of the electrically insulating body and comprising a lateral high-side power transistor,
wherein the lateral high-side power transistor is electrically connected to the vertical low-side power transistor through one or more first electrically conductive paths embedded in the electrically insulating body to form a switch node of a half bridge circuit configured to supply an output voltage to the load, the switch node being electrically connected to a corresponding one of the second terminals through one or more second electrically conductive paths embedded in the electrically insulating body; and
a controller configured to control operation of the power module and thereby regulate the dc power provided to the load.

12. The electronic system of claim 11, wherein the second semiconductor chip further comprises a first driver circuit monolithically integrated with the lateral high-side power transistor and configured to drive a control terminal of the lateral high-side power transistor.

13. The electronic system of claim 12, wherein the second semiconductor chip further comprises a second driver circuit monolithically integrated with the first driver circuit and the lateral high-side power transistor and configured to drive a control terminal of the vertical low-side power transistor, and wherein the second driver circuit is electrically connected to the control terminal of the vertical low-side power transistor through one or more fourth electrically conductive paths embedded in the electrically insulating body.

14. The electronic system of claim 13, wherein the second semiconductor chip further comprises a modulator monolithically integrated with the first driver circuit, the second driver circuit and the lateral high-side power transistor and configured to generate modulation signals for controlling switching of the lateral high-side power transistor and the vertical low-side power transistor, and wherein the modulator is electrically connected to the first driver circuit and the second driver circuit within the second semiconductor chip.

15. The electronic system of claim 14, wherein the second semiconductor chip further comprises the controller monolithically integrated with the modulator, the first driver circuit, the second driver circuit and the lateral high-side power transistor.

16. The electronic system of claim 11, wherein the vertical low-side power transistor is a vertical power MOSFET, wherein gate and source terminals of the vertical power MOSFET face the second side of the electrically insulating body and are electrically connected to corresponding ones of the second terminals through respective electrically conductive paths embedded in the electrically insulating body between the first semiconductor chip and the second side of the electrically insulating body, and wherein a drain terminal of the vertical power MOSFET faces the first side of the electrically insulating body and forms part of the switch node.

17. The electronic system of claim 16, wherein the lateral high-side power transistor is a lateral power MOSFET, wherein gate and drain terminals of the lateral power MOSFET face the first side of the electrically insulating body and contact corresponding ones of the first terminals, and wherein a source terminal of the lateral power MOSFET faces the first side of the electrically insulating body, forms part of the switch node and is electrically connected to the drain terminal of the vertical power MOSFET through respective electrically conductive paths embedded in the electrically insulating body between the first semiconductor chip and the first side of the electrically insulating body.

18. The electronic system of claim 17, wherein the source terminal of the lateral power MOSFET and the drain terminal of the vertical power MOSFET at least partly overlap with one another.

19. The electronic system of claim 11, wherein the electrically insulating body of the embedding structure is a non-conductive substrate of a printed circuit board, wherein the non-conductive substrate has a cavity, and wherein the first semiconductor chip is arranged in the cavity.

20. The electronic system of claim 11, wherein the first semiconductor chip and the second semiconductor chip form a non-isolated point-of-load power converter configured to accept power input from an isolated dc-dc converter and provide dc power to the load.

21. The electronic system of claim 11, wherein the first terminals are electrically connected to corresponding ones of the second terminals through third electrically conductive paths embedded in the electrically insulating body.

22. A power module, comprising:
   an embedding structure comprising an electrically insulating body, a first set of terminals at a first side of the electrically insulating body, and a second set of terminals at a second side of the electrically insulating body opposite the first side;
   a first semiconductor chip embedded in the electrically insulating body and comprising a vertical low-side power transistor; and
   a second semiconductor chip attached to the first set of terminals at the first side of the electrically insulating body and comprising a lateral high-side power transistor,
   wherein all signal I/O and input power connections to the second semiconductor chip are provided by a subset of the second set of terminals at the second side of the electrically insulating body and by electrically conductive paths embedded in the electrically insulating body,
   wherein the vertical low-side power transistor and the lateral high-side power transistor are electrically connected within the embedding structure to form a switch node of a half bridge circuit,
   wherein a terminal included in the second set of terminals at the second side of the electrically insulating body provides a point of external electrical contact for the switch node.

23. The power module of claim 22, wherein the second semiconductor chip further comprises a driver circuit for the lateral high-side power transistor.

* * * * *